(12) United States Patent
Degani et al.

(10) Patent No.: US 6,678,167 B1
(45) Date of Patent: Jan. 13, 2004

(54) HIGH PERFORMANCE MULTI-CHIP IC PACKAGE

(75) Inventors: Yinon Degani, Highland Park, NJ (US); Thomas Dixon Dudderar, Chatham, NJ (US); King Lien Tai, Berkeley Heights, NJ (US)

(73) Assignee: Agere Systems INC, Allentown, PA (US)

(*) Notice: Subject to any disclaimer, the term of this patent is extended or adjusted under 35 U.S.C. 154(b) by 0 days.

(21) Appl. No.: 09/498,005

(22) Filed: Feb. 4, 2000

(51) Int. Cl.[7] .............................. H05K 7/02; H05K 7/06; H05K 7/08; H05K 7/10
(52) U.S. Cl. ..................... 361/760; 361/761; 361/764; 361/735; 361/736; 361/748; 361/749; 361/767; 361/790
(58) Field of Search .................... 361/760, 735, 361/790, 764, 767, 748, 736, 749, 709, 717, 761, 803; 257/707, 706, 717, 720, 723

(56) References Cited

U.S. PATENT DOCUMENTS

| 5,239,198 A | * | 8/1993 | Lin et al. ............... 257/693 |
| 5,430,611 A | * | 7/1995 | Patel et al. ............. 361/705 |
| 5,474,458 A | * | 12/1995 | Vafi et al. .............. 439/91 |
| 5,477,082 A | * | 12/1995 | Buckley et al. ......... 257/679 |
| 5,521,435 A | * | 5/1996 | Mizukoshi .............. 257/698 |
| 5,544,017 A | * | 8/1996 | Beilin et al. ........... 361/790 |
| 5,646,828 A | * | 7/1997 | Degani et al. .......... 361/715 |
| 5,744,862 A | * | 4/1998 | Ishii ..................... 257/693 |
| 5,901,041 A | * | 5/1999 | Davies et al. .......... 361/704 |
| 6,005,771 A | * | 12/1999 | Bjorndahl et al. ...... 361/699 |
| 6,072,122 A | * | 6/2000 | Hosoya .................. 174/52.4 |
| 6,160,718 A | * | 12/2000 | Vakilian ................. 361/803 |
| 6,222,265 B1 | * | 4/2001 | Akram et al. ........... 257/723 |
| 6,274,929 B1 | * | 8/2001 | Leong et al. ........... 257/724 |
| 6,281,042 B1 | * | 8/2001 | Ahn et al. .............. 438/108 |
| 6,326,696 B1 | * | 12/2001 | Horton et al. .......... 257/777 |

* cited by examiner

Primary Examiner—David Martin
Assistant Examiner—Thanh Y. Tran
(74) Attorney, Agent, or Firm—Peter V.D. Wilde

(57) ABSTRACT

The specification describes a multi-chip IC package in which IC chips are flip-chip bonded to both sides of a flexible substrate. The upper (or lower) surface of the flexible substrate is bonded to a rigid support substrate with openings in the support substrate to accommodate the IC chips bonded to the upper (or lower) surface of the flexible substrate. In a preferred embodiment a plurality of IC memory chips are mounted on one side of the flexible substrate and one or more logic chips to the other. A very thin flexible substrate is used to optimize the length of through hole interconnections between the memory and logic devices. If logic chips are flip-chip mounted in the cavity formed by the openings, a heat sink plate can be used to both cap the cavity and make effective thermal contact the backside of the logic chips.

10 Claims, 2 Drawing Sheets

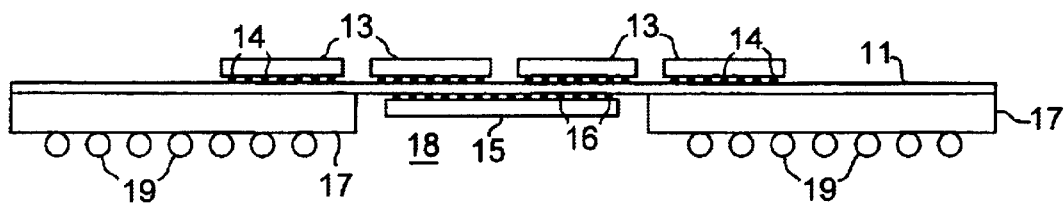
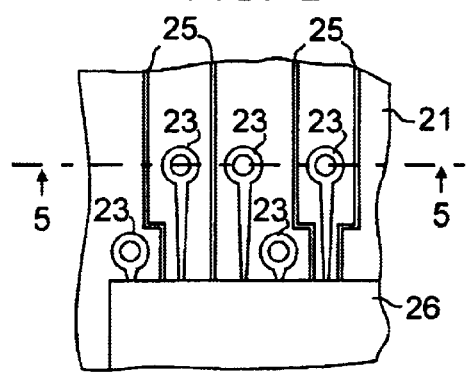
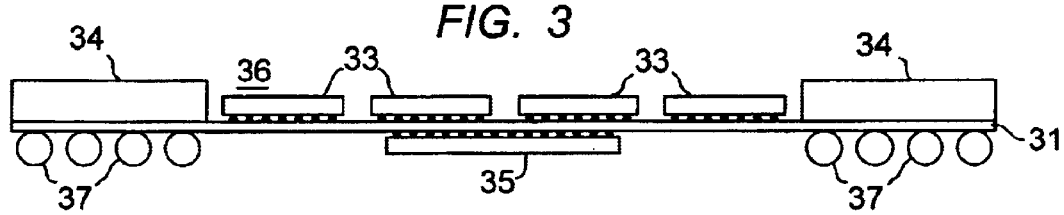

HIGH PERFORMANCE MULTI-CHIP IC PACKAGE

FIELD OF THE INVENTION

This invention relates to flip chip integrated circuit (IC) packages and more specifically to multi-chip IC packages with high interconnect density.

BACKGROUND OF THE INVENTION

Multi-chip IC packages are becoming standard in the IC industry because of increased device packing density, which translates into smaller packages with reduced cost. Typical multi-chip packages have multiple chips or multi-chip modules carried by a printed wiring board. In an effort to increase device packing density, IC packages have been proposed and used with multiple chips mounted on both sides of a printed wiring board. This approach complicates the interconnection strategy in the overall assembly, but reduces by nearly one-half the footprint of the IC package. More recent developments in high density, low cost, IC packaging have taken advantage of flexible substrates which in some package designs allow more versatility for final assembly of the system. Flexible substrates are also used increasingly due to very fine, and thus dense, interconnection patterns. Also, flexible substrates permit simple through hole interconnections. It has also been proposed to populate both sides of a flexible substrate with active devices. Thin interconnect substrates that have through hole interconnections may be used to advantage to reduce the interconnection length between critical device components. Thinner substrates produce shorter interconnections. However, there is a limit to reducing substrate thickness and still have a robust IC package. It has been proposed to bond flexible substrates to rigid substrates to provide a sturdy package with added interconnect levels, but this eliminates the option of having devices mounted on both sides of the flexible substrate.

STATEMENT OF THE INVENTION

We have developed a high density multi-chip package using ultra thin flexible substrates with active chips on both sides of the flexible substrate. In the preferred embodiment, logic chips are mounted on one side of the flexible substrate and memory chips on the other side. The thin flexible substrate is provided with mechanical support by bonding the flexible substrate to a rigid support substrate, e.g., a metal sheet or a printed circuit board. Openings in the support substrate are provided to accommodate the IC chips on the side of the flexible substrate that is bonded to the rigid board. Interconnections between the logic and memory chips are made using vias, and the vias are exceptionally short due to the very thin flexible substrate. This arrangement also allows efficient heat sinking of the IC chips in the recessed portion of the rigid board by covering the recessed portion with a heat sink plate.

BRIEF DESCRIPTION OF THE DRAWING

FIG. 1 is a schematic representation of one embodiment of the double-sided flexible substrate multi-chip IC package of the invention;

FIG. 2 is a plan view of a portion of the flexible substrate of FIG. 1;

FIG. 3 is a schematic representation of a second embodiment of the double-sided flexible substrate multi-chip IC package of the invention;

DETAILED DESCRIPTION

Figure 4:
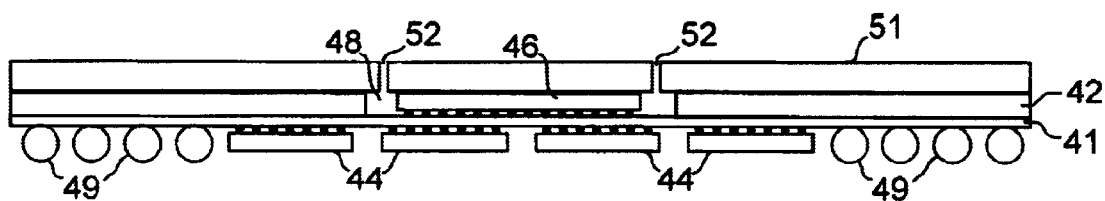
FIG. 4 is a schematic representation of a third embodiment of the double-sided flexible substrate multi-chip IC package of the invention.

A flexible substrate with IC chips mounted on both sides of the flexible substrate is shown in FIG. 1. The flexible substrate 11 carries a plurality of IC memory chips 13 bonded with solder bumps 14 to the top of the substrate. A logic IC chip 15 is bonded with solder bumps 16 to the underside of substrate 11. The flexible substrate has printed circuit interconnections (not shown for clarity) on both sides of the flexible substrate providing interconnections for the IC chips. The flexible substrate 11 is bonded to a support substrate 17 which may be any appropriate rigid board that has interconnection sites on both sides. In this embodiment, support substrate 17 is preferably a standard epoxy printed wiring board. The term rigid in the context of this prescription is intended to mean any board structure with rigidity greater than that of the flexible substrate 11. The support substrate 17 adds a second level of interconnection, and has through hole interconnections (not shown) for interconnecting the multiple chips 13 to the ball grid array (BGA) shown at 19. IC chip 15 is interconnected to the BGA by the printed circuit on the lower surface of the flexible substrate 11. The BGA is connected to the next board level. The advantage of having a large pitch at this level in the package is that support substrate 17 can be flip-bonded to a printed wiring board using large BGA solder bumps or balls. Large solder interconnections are very reliable and can be made with high yield. The solder bump sites on the IC chips 13 and 15 are normally provided with under bump metallization (UBM), which typically comprises solder wettable pads of e.g. Cu—Cr alloy or Ti—Pt—Au. The solder bump sites on the flexible substrate 11 are preferably pads incorporated in the copper printed circuits and the solder bumps can be soldered directly to the copper pads.

The support substrate 17 is provided with openings 18 to accommodate the IC chips mounted on the underside of the flexible substrate.

It is evident in the arrangement of FIG. 1 that the footprint of the IC chips mounted on the underside of the flexible substrate is constrained by the openings in the support substrate. However, typical expoxy printed wiring boards, e.g. FR4 boards, have sufficient structural integrity that a large percentage of the board area can be provided with openings such as opening 18. It is also evident from FIG. 1 that the number and arrangement of IC chips on the top surface of flexible substrate 11 is unconstrained.

As shown in FIG. 1, the IC array with the larger footprint will be mounted on the top side of the flexible substrate, where the footprint may exceed the area of the openings in the support substrate 17. Where the multi-chip package contains memory and logic chips, it is preferred that the memory chips be mounted on one side of the flexible substrate, where interconnections between memory chips, especially the $V_{DD}$ and $V_{SS}$ busses, are conveniently accommodated, and the IC logic chips mounted on the other side of the flexible substrate. The memory chip array will typically be the larger array and thus mounted, in the arrangement of FIG. 1, on the side of the flexible substrate that is unconstrained, i.e. is not bonded to the support substrate.

The interconnection density of the IC package of FIG. 1 can be very high since interconnection circuitry may be provided on both sides of the flexible substrate. A cutaway portion of the flexible substrate is shown in FIG. 2. Flexible substrate 21 is provided with through hole interconnections 23. Runners 25 provide interconnections between IC chips and shorter versions may provide interchip interconnections. A portion of an IC chip is shown at 26.

In the embodiment of FIG. 1 the through hole interconnections may be for interconnections between IC chips on opposite sides of the flexible substrate, or may be for interconnections between the top side of the flexible substrate and the support substrate 17. It will be appreciated by those skilled in the art that elements in the figures described herein are not necessarily drawn to scale. The through holes and the printed circuits on the flexible substrate are typically very fine.

Figure 5:
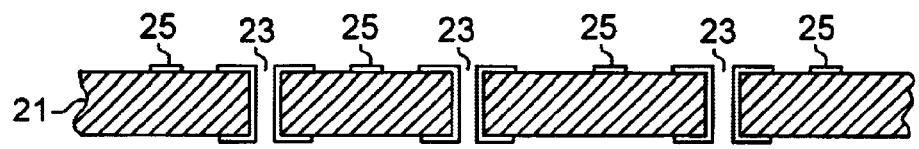
FIG. 5 is a section view through 5—5 of FIG. 2.

A section view showing the through hole interconnections in more detail is given in FIG. 5.

An alternative embodiment of the invention is shown in FIG. 3. Here the flexible substrate 31 carries the same IC chip contingent, i.e. memory IC chips 33 and logic chip 35, as in FIG. 1. The support substrate 34, with opening 36, is used in this embodiment mainly to provide rigidity, and interconnections on this support substrate are not required. Accordingly, the support substrate may be made from a variety of materials, e.g. epoxy FP4, or a thermally conductive material, e.g. Cu, Al. The preferred choice is copper, which has thermal expansion characteristics compatible with commonly used interconnect substrates. The BGA 37 for interconnecting the IC chips to the next level is solder bump bonded directly to flexible substrate 31. This embodiment allows a large area for routing on the lower side of the flexible substrate.

Another embodiment of the double sided flexible substrate assembly of the invention is shown in FIG. 4. This represents the preferred embodiment of the three shown. Here the flexible substrate 41 is bonded to support substrate 42. A memory IC chip array 44 is solder bump bonded to the lower side of the flexible substrate and one or more logic IC chips, represented by IC chip 46, are solder bump bonded to the upper side of the flexible substrate. The support substrate has opening 48 to accommodate IC chip 46. BGA 49 is bonded to the lower side of the flexible substrate as shown. Interconnections between the elements are implemented as described above. The thickness of the support substrate 41 is made to approximate the thickness of IC chip 46 plus the standoff due to the solder bump bonds for IC chip 46. This allows a thermally conductive heat sink 51 to be intimately attached to the IC chip 46. In the embodiment shown, IC chip 46 is a logic chip which typically has the largest number of IOs in the multiple IC chip assembly, and in many applications requires heat sinking to prevent overheating of the chip in operation. The heat sink 51 is typically a metal plate bonded to the backside of IC chip 46 and to the support substrate 42. The heat sink plate provides additional structural integrity for the package and may serve also as a cover for the assembly. Heat sink plate 51 may also be provided with holes 52 to allow underfill to be injected into the cavity 48, providing further package integrity and protection from hostile ambients. The underfill and the heat sink plate bonding operations may be combined for convenience, and use the same epoxy material. It will be understood by those skilled in the art that in the structure of FIG. 4, the support substrate 42 functions mainly as a standoff member or spacer, and accordingly can be combined with or integrated with the heat sink plate 51, e.g., elements 51 and 42 can be a single member. It will also be appreciated that the flexibility of flexible substrate 41 aids in creating intimate contact between the backside of IC chip 46 and the heat sink plate 51. Heat sink plate 51 may be formed of a heat conductive metal, e.g. copper or aluminum. In the preferred case the spacer/heat sink plate is copper.

The multi-chip package of the invention offers the advantage of high interconnect density by flip-chip mounting IC chips on both sides of an interconnect substrate, and interconnecting the IC chips through the substrate with optimization of lead lengths resulting from the use of a very thin flexible substrate. Preferably the flexible substrate is a polymer, such as polyimide, with a thickness of less than 10 mils and preferably less than 4 mils. The printed circuit on each side of the flexible substrate preferably has a thickness in the range 0.5–2.0 mils. In the embodiment shown, the flexible substrate has two interconnect levels. However, the flexible substrate may also have a multilevel interconnect structure with, e.g., two polymer sheets and four interconnect levels. Multilevel structures can be made with overall thickness less than 10 mils, which will provide suitable flexibility.

The IC chips are typically thinned at the wafer level to approximately 6–20 mils, starting with, e.g., a 30 mil thick wafer. Thus in the embodiment of FIG. 4, the IC chip thickness and the standoff, typically 1–5 mils, result in an overall standoff between the flexible substrate surface and the backside of the IC chip of 7–25 mils. The support substrate 42, or alternatively the spacer elements in whatever form used, have a corresponding thickness to allow effective thermal contact with the IC chip backside. The vias through the flexible substrate will typically be 0.5–2.0 mils in diameter formed, e.g., by laser drilling.

The flexibility of the flexible substrate described for this invention is a function of the substrate material and thickness. A polymer substrate with a thickness less than 10 mils and preferably less than 4 mils will generally afford the appropriate flexibility and the desired short through hole interconnections.

Some aspects of the invention can be implemented with more standard substrates, e.g. printed wiring boards and ceramic substrates. For example, the placing memory chips on one side of a double sided support substrate and logic chips on the other, or of providing openings on one side of the board to accommodate IC chips in a recessed chip arrangement, have advantages and valuable applications even when applied to ceramic substrates. The substrates in these cases may be thicker than 10 mils, e.g. up to 30 mils.

Flip-chip bonding as used in connection with the invention is well known in the art and involves solder bump bonding of an IC chip to a substrate with the active side of the active chip facing the surface of the substrate. The space between the IC chip and the substrate, commonly referred to as standoff, may be filled with an epoxy underfill to impart robustness to the package and protect the active surface of the IC device from hostile environments.

It should be evident that the IC chips bonded to the flexible substrate in the cavity formed by the openings in the support substrate are approximately aligned in the vertical plane to the IC chips bonded on the other side of the flexible substrate so that through hole interconnections align with regions containing both chips or groups of chips. The term "opposite" when used in this context either herein or in the appended claims is intended to define this arrangement.

Various additional modifications of this invention will occur to those skilled in the art. All deviations from the specific teachings of this specification that basically rely on the principles and their equivalents through which the art has been advanced are properly considered within the scope of the invention as described and claimed.

We claim:
1. An IC package comprising:
 a. a rigid support member having an upper surface and a lower surface, and at least one opening extending through the support member from the upper surface to the lower surface, b. a polymer substrate with a thickness of less than 10 mils and having an upper surface and a lower surface with the lower surface bonded to the upper surface of the support member thereby combining with the opening extending through the support member to form an open cavity, c. at least one IC chip flip-chip bonded to the lower surface of the substrate in the cavity, d. at least one IC chip flip-chip bonded to the upper surface of the substrate, e. a plurality of through hole interconnections through the substrate extending from the lower surface in the cavity to the upper surface, the through hole interconnections interconnecting the at least one flip-chip bonded to the lower surface of the substrate to the at least one IC chip flip-chip bonded to the upper surface of the substrate and f. an array of solder bumps on the lower surface of the support member with through hole interconnections through the support member interconnecting the array of solder bumps to the lower surface of the substrate.

2. The IC package of claim 1 wherein the at least one IC chip flip-chip bonded to the lower surface of the substrate is a logic chip and the at least one IC chip flip-chip bonded to the upper surface of the substrate comprises an array of memory chips.

3. The IC package of claim 1 wherein the at least one IC chip flip-chip bonded to the lower surface of said substrate is an array of memory chips and the at least one IC chip flip-chip bonded to the upper surface of the substrate comprises at least one logic chip.

4. An IC package comprising:
   a. a rigid support substrate having:
      i. an upper surface,
      ii. a lower surface,
      iii. at least one opening extending through the support substrate from the upper surface to the lower surface,
   b. a flexible substrate of a polymer with a thickness less than 10 mils having:
      i. an upper surface,
      ii. a lower surface, the lower surface bonded to the upper surface of the support substrate thereby combining with the opening in the support substrate to form an open cavity,
      iii. a first printed circuit on the upper surface,
      iv. a second printed circuit on the lower surface located in the open cavity,
      v. a plurality of through hole interconnections interconnecting the first printed circuit and the second printed circuit,
   c. at least one IC memory chip flip-chip bonded to the upper surface of the flexible substrate and interconnected to the first printed circuit,
   d. at least one IC logic chip flip-chip bonded to the lower surface of the flexible substrate in the cavity and interconnected to the second printed circuit, and
   e. an array of solder bumps provided on the upper surface of the flexible substrate with the array of solder bumps interconnected to the at least one IC memory chip.

5. The IC package of claim 4 wherein the support member substrate is a metal sheet.

6. The IC package of claim 4 wherein the support member substrate is an epoxy printed wiring board.

7. The IC package of claim 4 further including a heat sink plate attached to both the lower surface of the support member and the at least one IC logic chip.

8. The IC package of claim 7 wherein the support member substrate and the heat sink plate are a single member.

9. The IC package of claim 4 further including a ball grid array attached to the lower surface of the support member.

10. The IC package of claim 4 further including a ball grid array attached to the upper surface of the flexible substrate.

* * * * *